United States Patent [19]

Mathews et al.

[11] Patent Number: 5,354,705
[45] Date of Patent: Oct. 11, 1994

[54] TECHNIQUE TO FABRICATE A CONTAINER STRUCTURE WITH ROUGH INNER AND OUTER SURFACES

[75] Inventors: Viju Mathews; Pierre Fazan, both of Boise, Id.

[73] Assignee: Micron Semiconductor, Inc., Boise, Id.

[21] Appl. No.: 122,639

[22] Filed: Sep. 15, 1993

[51] Int. Cl.$^5$ .................... H01L 21/70; H01L 27/00
[52] U.S. Cl. .................... 437/52; 437/60; 437/919
[58] Field of Search .................... 437/47, 52, 60, 919

[56] References Cited

U.S. PATENT DOCUMENTS 5,162,248  11/1992  Dennison et al. .................... 437/52

FOREIGN PATENT DOCUMENTS 1-257365  10/1989  Japan .

OTHER PUBLICATIONS

"Crown-Shaped Stacked-Capacitor Cell for 1.5-V Operation 64-Mb DRAM's" by Kaga et al., IEEE Trans. on Electron Devices, vol. 38, No. 2, Feb. 1991. pp. 255–261.

"A Stacked Capacitor Cell with Ring Structure" by Shinmura et al, Extended Abstracts of the 22nd Conference on Solid State Devices and Materials, (1990 International), pp. 833–836.

*Primary Examiner*—Olik Chaudhuri
*Assistant Examiner*—H. Jey Tsai
*Attorney, Agent, or Firm*—David J. Paul

[57] ABSTRACT

The present invention provides a method for forming conductive container structures on a supporting substrate of a semiconductor device, by: forming an insulating layer over parallel conductive lines and existing material on the surface of the supporting substrate; providing openings into the insulating layer, the openings forming vertical sidewalls in the insulating layer that resides between two neighboring conductive lines and thereby exposing an underlying conductive material; forming a sacrificial layer that makes contact with the underlying conductive material; forming a barrier layer overlying and conforming to the sacrificial layer; forming insulating spacers on the vertical sidewalls of the barrier layer; removing portions of the barrier layer and the sacrificial layer that span between the insulating spacers to thereby expose a portion of the underlying conductive material; removing the insulating spacers and thereby exposing the barrier layer; forming a conductive layer that conforms to the exposed barrier layer, makes contact to the underlying conductive material and forms multiple containers; forming a filler material in the container; removing portions of the conductive layer, the barrier layer and the sacrificial layer down to an upper portion of the insulating layer, thereby forming individual the container structures; removing the insulating layer, thereby exposing the sacrificial layer surrounding the outer surfaces of the container structures; and removing the sacrificial layer, the remaining barrier layer and the filler layer, thereby exposing the outer and inner surfaces of the container structures.

38 Claims, 3 Drawing Sheets

TECHNIQUE TO FABRICATE A CONTAINER STRUCTURE WITH ROUGH INNER AND OUTER SURFACES

CROSS REFERENCE TO A RELATED APPLICATION

This application is related to U.S. Pat. No. 5,162,248, U.S. Pat. No. 5,278,091 and U.S. patent application Ser. No. 08/106,503, filed Aug. 13, 1993, all of which are assigned to the same Assignee.

FIELD OF THE INVENTION

This invention relates generally to semiconductor fabrication and in particular to a fabrication method which provides a container capacitor structure for a dynamic random access memory (DRAM) device.

BACKGROUND OF THE INVENTION

As semiconductor devices become more and more dense, it has become necessary to maximize the amount of die space used in order to successfully manufacture these dense devices while retaining relatively small package sizes. This is particularly true with dynamic random access memories as memory density has increased while the space allowed for each storage capacitor has decreased.

In dynamic semiconductor memory storage devices it is essential that storage node capacitor cell plates be large enough to retain an adequate charge (or capacitance) in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

A paper submitted by N. Shinmura, et al., entitled "A Stacked Capacitor Cell with Ring Structure," Extended Abstracts of the 22nd International Conference on Solid State Devices and Materials, 1990, pp. 833–836, discusses a 3-dimensional stacked capacitor incorporating a ring structure around the main electrode to effectively double the capacitance of a conventional stacked capacitor.

The ring structure and its development is shown in FIGS. 1(c) through 1(g), pp. 834 of the article mentioned above. FIG. 1(a), on the same page shows a bird's eye-view of storage electrodes. The storage node is formed by two polysilicon layers that form a core electrode encircled by a ring structure. Capacitor dielectric film surrounds the whole surface of the storage node electrode and then is covered with a third polysilicon layer to form the top capacitor electrode and completes the storage cell.

Also, in a paper submitted by T. Kaga, et al., entitled "Crown-Shaped Stacked-Capacitor Cell for 1.5V Operation 64-Mb DRAM's," IEEE Transactions on Electron Devices. VOL. 38, NO. 2, February 1991, pp. 255–261, discusses a self-aligned stacked-capacitor cell for 64-Mb DRAM's, called a CROWN cell. The CROWN cell and its development are shown in FIGS. 7(d) through 7(f), pp. 258 of this article. The crown shaped storage electrode is formed over word and bit lines and separated by a oxide/nitride insulating layer with the top insulating layer being removed to form the crown shape. Capacitor dielectric film surrounds the whole surface of the storage node electrode and the top capacitor electrode is formed to complete the storage cell.

U.S. Pat. No. 5,162,248, having the same assignee as does the present invention, is a related process to form a container cell. All publications cited herein are hereby incorporated by reference.

SUMMARY OF THE INVENTION

The method of the present invention introduces a fabrication method for forming conductive container structures on a supporting substrate of a semiconductor device, with the method comprising the steps of:

forming an insulating layer over substantially parallel conductive lines and existing material on the surface of the supporting substrate;

providing openings into the insulating layer, the openings forming substantially vertical sidewalls in the insulating layer that resides between two neighboring conductive lines and thereby exposing an underlying conductive material;

forming a sacrificial layer that makes contact with the underlying conductive material;

forming a barrier layer overlying and conforming to the sacrificial layer;

forming insulating spacers on the substantially vertical sidewalls of the barrier layer;

removing portions of the barrier layer and the sacrificial layer that span between the insulating spacers to thereby expose a portion of the underlying conductive material;

removing the insulating spacers and thereby exposing the barrier layer;

forming a conductive layer that conforms to the exposed barrier layer, makes contact to the underlying conductive material and forms multiple containers;

forming a filler material in the container;

removing portions of the conductive layer, the barrier layer and the sacrificial layer down to an upper portion of the insulating layer, thereby forming individual the container structures;

removing the insulating layer, thereby exposing the sacrificial layer surrounding the outer surfaces of the container structures; and removing the sacrificial layer, the remaining barrier layer and the filler layer, thereby exposing the outer and inner surfaces of the container structures.

DETAILED DESCRIPTION OF THE INVENTION

The present invention, as depicted in FIGS. 1–5, demonstrates process steps integrated into the fabrication of a dynamic random access memory (DRAM) to fabricate a stacked capacitor container structure in a memory array of a DRAM. Though, the process described hereinafter, refers to DRAM fabrication, it is meant to serve as an example for practicing the present invention. As one skilled in the art will recognize from the detailed description that follows, the present invention may be integrated into any semiconductor fabrication process that requires providing storage cells as memory elements or any structure that can use a container structure.

Figure 1:
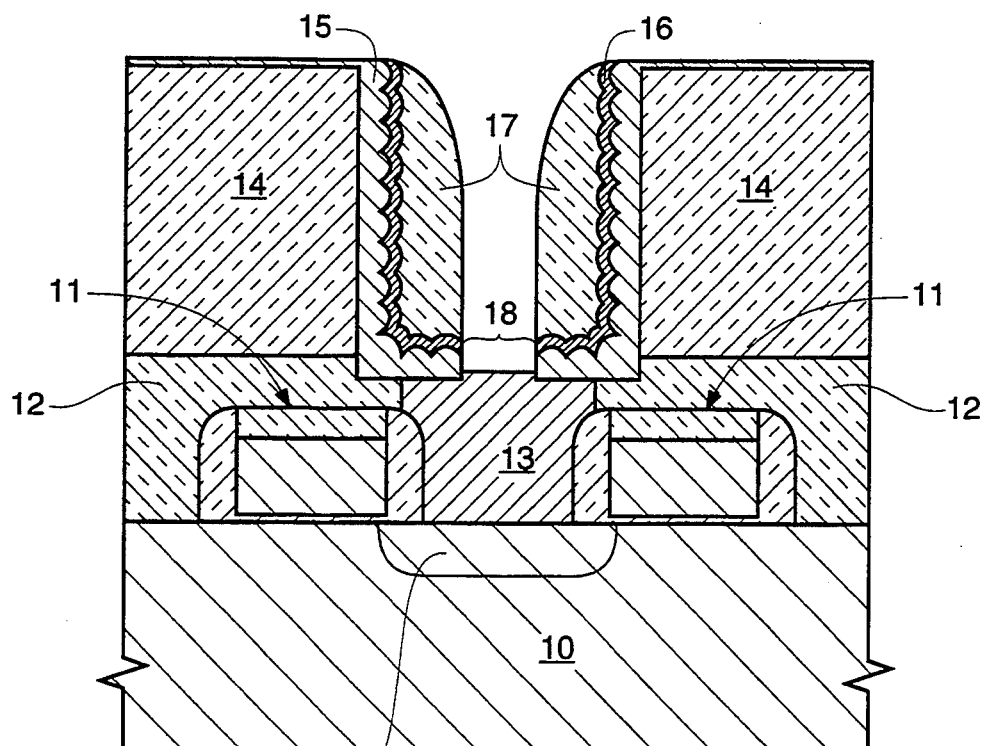
FIG. 1 is a composite cross-sectional view of an in process wafer portion depicting the beginning stages of the present invention.

Referring now to FIG. 1, supporting substrate 10, such as a silicon wafer, comprises diffusion regions 10.1 implanted in between conductive strips 11 (or referred hereinafter as conductive wordlines for the specific embodiment). This cross-section shows a wordline bridging between two diffusion region 10.1, thereby forming an active field effect transistor (FET). A pair of neighboring and substantially parallel wordlines are insulated from subsequently formed layers by a planarized insulating material 12, such as tetra-ethyl-ortho-silicate (TEOS). In between the pair of wordlines 11 a conductive plug 13 that connects to the underlying diffusion region 10.1 is formed. Though the conductive plug is not necessary to practice the present invention, it is preferred and the plug may be formed out of such conductive materials as metals, metal silicides or conductively doped polysilicon.

Next, a second planarized insulating layer 14, such as borophosphosilicate glass (BPSG), is formed overlying insulating layer 12 and conductive plug 13. An opening is formed into insulating layer 14 to expose the upper surface of plug 13 and form substantially vertical sidewalls into layer 14. Once plug 13 is exposed, a conformal sacrificial layer 15 is formed that blankets the top and sidewalls of layer 14, as well as the exposed upper surface of plug 13. Next, a barrier layer 16 is formed over sacrificial layer 15, followed by the forming of insulating spacers 17 to cover the resulting vertical sidewalls.

After spacers 17 formation, portions of underlying material 18, comprising barrier layer 16 and sacrificial layer 15 that span between spacers 17, are removed. During the removal of material 18 it is preferred that a thin portion of sacrificial layer 15 remains over the top of insulating layer 14 so that a subsequent removal of spacers 17 does not also remove any of insulating layer 14. Also, in the preferred embodiment, sacrificial layer 15 is rugged polysilicon (i.e. hemispherical grained polysilicon) so that a rugged patterned is transferred to the final structure. Still further, it is preferred that barrier layer 16 be nitride and spacers 17 be oxide. A dry etch is performed to remove the portions of barrier layer 16 and sacrificial layer 15 as mentioned above. It is also preferred that layers 12 and 14 are planarized by such methods as chemical mechanical polishing (CMP). It is important to realize that sacrificial layer 15 may be any material that can be readily removed. Also, layer 12 is planarized when plug 13 is formed and layer 14 need not be planarized. However if sacrificial layer 15 is not a conductive material then the subsequent removal of material 18 (discussed below) must be complete so that plug 13 is exposed. When taking this approach one must take into account the fact that much of layer 14 will be removed along with the removal of spacers 17.

Figure 2:
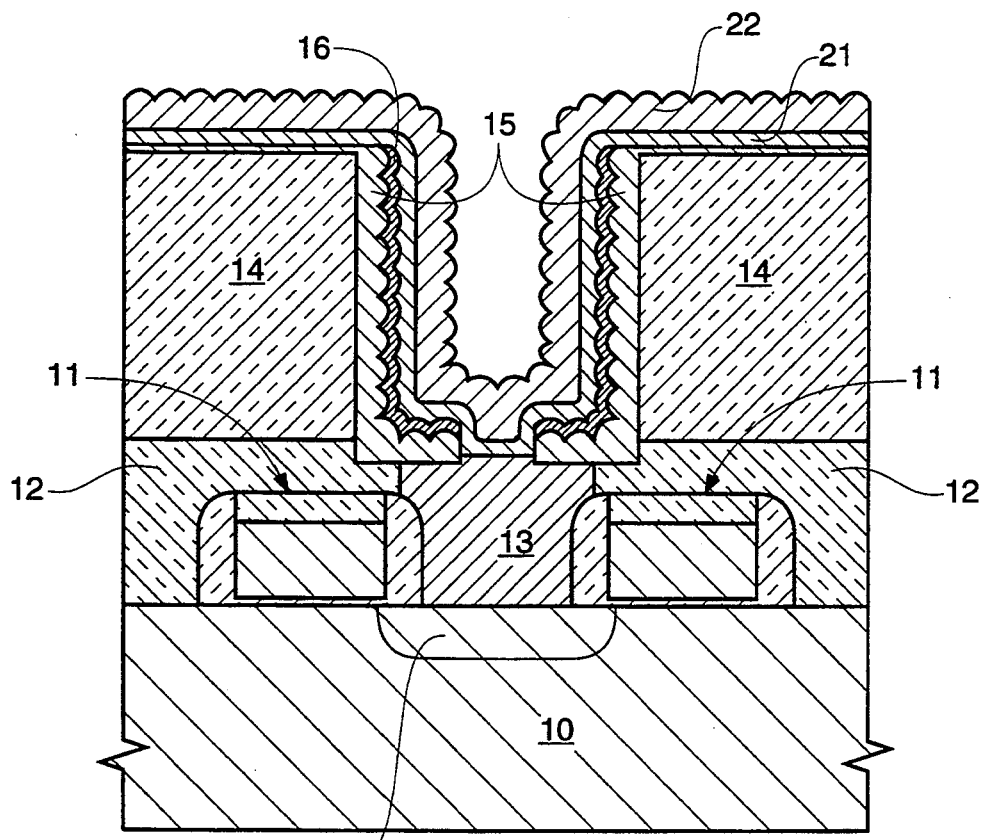
FIG. 2 is a composite cross-sectional view of the in process wafer portion of FIG. 1, after formation of a container structure.

Referring now to FIG. 2, spacers 17 (of FIG. 1) are removed and a conductive layer 21, such as in-situ doped polysilicon, is formed to cover barrier layer 16 in order to coat the sidewalls (covered by sacrificial layer 15 and barrier layer 16), make contact to plug 13 (or a remnant of sacrificial layer 15) and thereby form a container structure 23. It is optional to also form a second rugged conductive layer 22 over conductive layer 21. By doing this, the final resulting container structure will also have a rugged inner surface as well as an outer rugged surface (once again conductively doped rugged polysilicon such as hemispherical grained polysilicon is preferred). Regardless if optional layer 22 is formed, filler material 31 is formed to completely enclose container structure 23. Photoresist works well as filler material 31.

Figure 3:
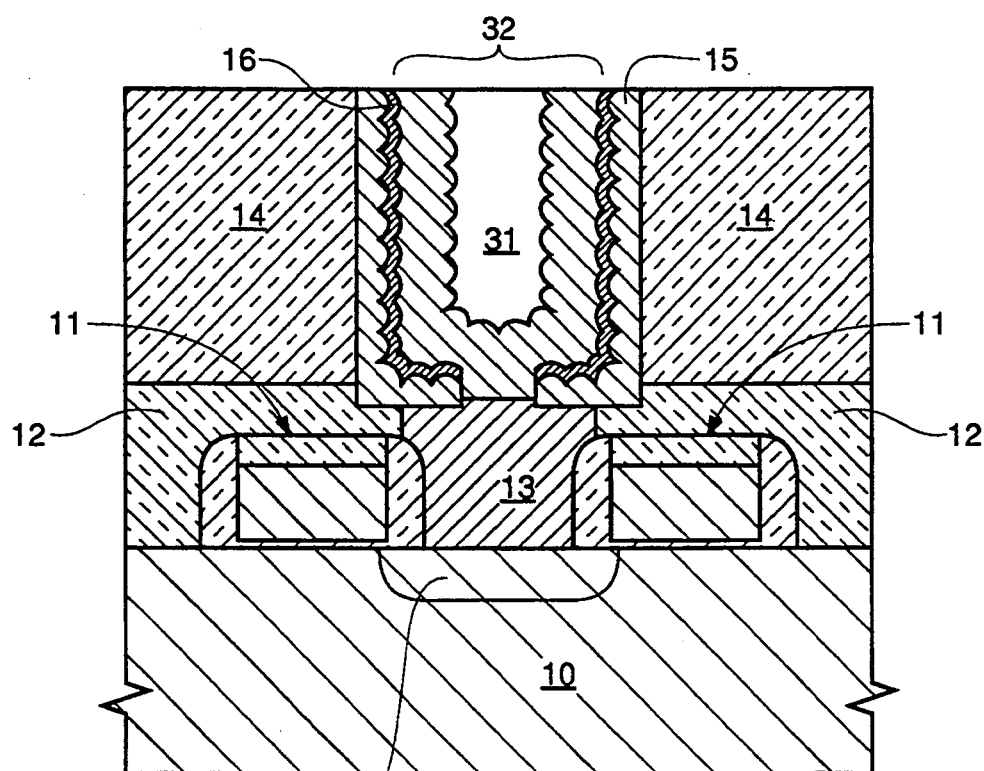
FIG. 3 is a composite cross-sectional view of the in process wafer portion of FIG. 2, after a planarization step and insulation removal are performed.

Referring now to FIG. 3, a planarization step is performed to remove conductive layer 22 (if present), conductive layer 21, and the remaining portion of barrier layer 16 down to the upper portion of insulating layer 14. It is preferred that CMP is used for this planarization step. Once planarization is complete, container structures are separated into individual container structures 32. The planarization step provides the advantage of not leaving behind any conductive stringers from layers 21 and 22 that would normally be present on a nonplanar surface.

Figure 4:
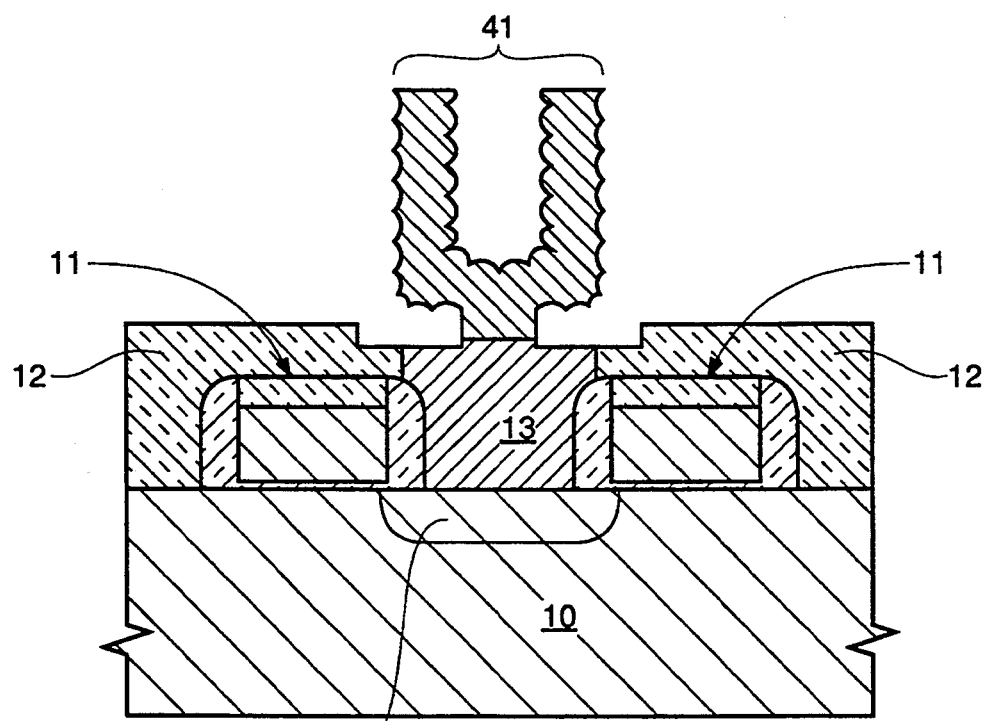
FIG. 4 is a composite cross-sectional view of the in process wafer portion of FIG. 3, after material is removed to expose the inner and outer surfaces of the container structure.

Referring now to FIG. 4, insulating layer 14, sacrificial layer 15 and barrier layer 16 (all seen in FIG. 3) are removed thereby forming container structure 41. A wet polysilicon etch is used (if sacrificial layer 15 is polysilicon) which will also reduce the overall height of structure 41 as the upper surface of structure 41 is exposed after the planarization step. After sacrificial layer 15 is removed filler material 31 is then removed. Structure 41 now has both its inner and outer surfaces exposed which will increase the capacitance of the structure when used as a storage node cell plate.

Figure 5:
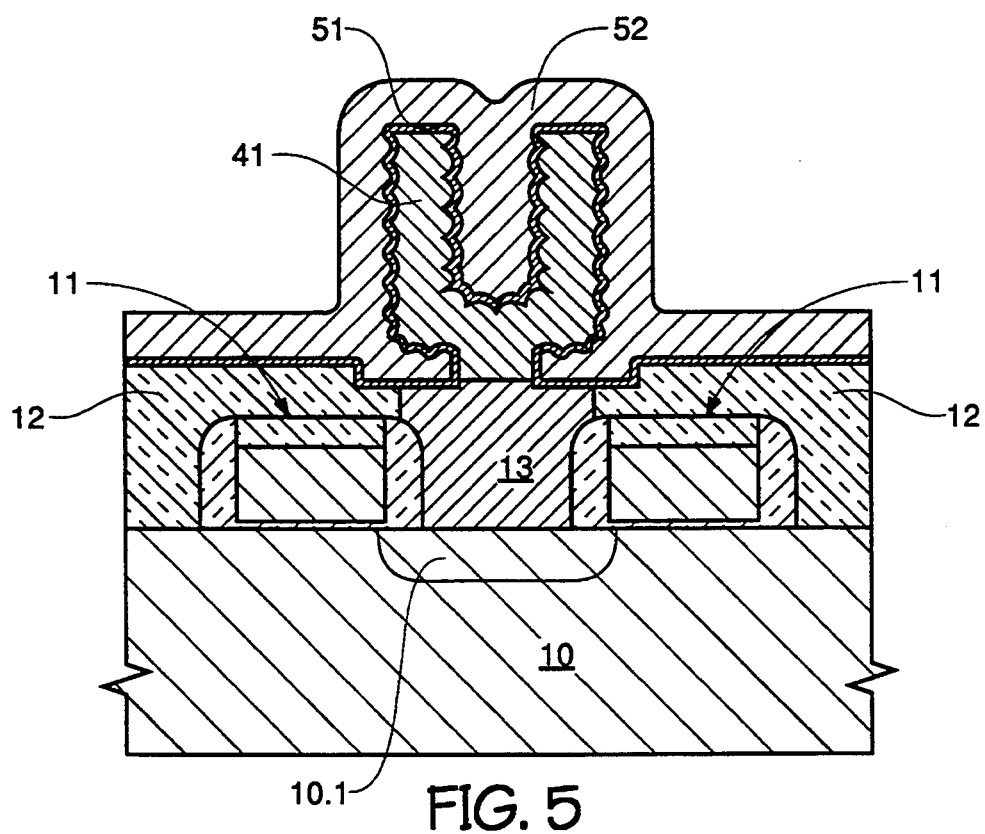
FIG. 5 is a composite cross-sectional view of the in process wafer portion of FIG. 3, depicting a final structure of a container structured stacked capacitor.

FIG. 5 depicts a specific example of integrating the present invention into a DRAM fabrication process. Container structure 41 is used as a storage node plate (also 41) having exposed inner and outer rugged surfaces. The storage capacitor is completed by forming a cell dielectric material 51 (such as oxide, nitride, or combinations thereof) over the container structured storage node plate 41 which is then followed by the formation of a conductive layer 52 that serves as the storage cell field plate (or second capacitor plate). The process of the specific example, then continues by conventional methods to complete the DRAM device.

It is to be understood that although the present invention has been described in a preferred embodiment, various modifications known to those skilled in the art may be made without departing from the invention as recited in the several claims appended hereto. For example, the present invention uses oxide and nitride as insulating layers and conductively doped polysilicon as conductive material, however many insulating agents, such as oxide/nitride composites, and other conductive materials, such as metals and metal silicides may be used as substitutes.

What is claimed is:

1. A method for forming conductive container structures on a supporting substrate of a semiconductor device, said method comprising the steps of:
   a) forming an insulating layer over parallel conductive lines and existing material on the surface of said supporting substrate;
   b) providing openings into said insulating layer, said openings forming vertical sidewalls in said insulating layer that resides between two neighboring conductive lines and thereby exposing an underlying conductive material;
   c) forming a sacrificial layer that makes contact with said underlying conductive material;
   d) forming a barrier layer overlying and conforming to said sacrificial layer;
   e) forming insulating spacers on the vertical sidewalls of the barrier layer;
   f) removing portions of said barrier layer and said sacrificial layer that span between said insulating spacers to thereby expose a portion of said underlying conductive material;
   g) removing said insulating spacers and thereby exposing said barrier layer;
   h) forming a conductive layer that conforms to said exposed barrier layer, makes contact to said underlying conductive material and forms multiple containers;
   i) forming a filler material in said container;
   j) removing portions of said conductive layer, said barrier layer and said sacrificial layer down to an upper portion of said insulating layer, thereby forming individual said container structures;
   k) removing said insulating layer, thereby exposing the sacrificial layer surrounding the outer surfaces of said container structures; and
   l) removing said sacrificial layer, the remaining barrier layer and said filler layer, thereby exposing the outer and inner surfaces of said container structures.

2. The method as recited in claim 1, wherein an additional step of forming a rugged conductive layer is performed after step (h).

3. The method as recited in claim 2, wherein said rugged conductive layer comprises rugged conductively doped polysilicon.

4. The method as recited in claim 3, wherein said rugged conductively doped polysilicon comprises the deposition of hemispherical grain polysilicon.

5. The method as recited in claim 1, wherein said supporting substrate comprises a silicon substrate.

6. The method as recited in claim 1, wherein said insulating layer comprises an insulating layer planarized by chemical mechanical polishing.

7. The method as recited in claim 6, wherein said planarized insulating layer comprises BPSG.

8. The method as recited in claim 1, wherein said existing material comprises a layer of planarized TEOS.

9. The method as recited in claim 1, wherein said underlying conductive material comprises a conductive plug connecting to an underlying diffusion region.

10. The method as recited in claim 1, wherein said sacrificial layer comprises rugged polysilicon.

11. The method as recited in claim 10, wherein said rugged polysilicon comprises the deposition of hemispherical grain polysilicon.

12. The method as recited in claim 1, wherein said barrier layer comprises nitride.

13. The method as recited in claim 1, wherein said insulating spacers comprise oxide.

14. The method as recited in claim 1, wherein said conductive layer comprises conductively doped polysilicon.

15. The method as recited in claim 1, wherein said filler material comprises photoresist.

16. A method for forming a plurality of conductive container capacitor cells between parallel conductive wordlines on a silicon substrate for a memory array in a semiconductive device, said method comprising the steps of:
   a) forming an insulating layer over said parallel conductive wordlines and existing material on the surface of said silicon substrate;
   b) providing openings into said insulating layer, said openings forming vertical sidewalls in said insulating layer that resides between neighboring conductive wordlines and thereby exposing an underlying conductive material;
   c) forming a sacrificial layer that makes contact with said underlying conductive material;
   d) forming a barrier layer overlying and conforming to said sacrificial layer;
   e) forming insulating spacers on the vertical sidewalls of the barrier layer;
   f) removing portions of said barrier layer and sacrificial layer that span between said insulating spacers to thereby expose a portion of said underlying conductive material;
   g) removing said insulating spacers and thereby exposing the remaining barrier layer;
   h) forming a conductive layer that conforms to said remaining exposed barrier layer, makes contact to said underlying conductive material and forms multiple containers;
   i) forming a filler material in said container;
   j) removing portions of said conductive layer, said barrier layer and said sacrificial layer down to an upper portion of said insulating layer, thereby forming individual container structures;
   k) removing said insulating layer, thereby exposing the sacrificial layer surrounding the outer surfaces of said container structures;
   l) removing said sacrificial layer, the remaining barrier layer and said filler layer, thereby exposing the outer and inner surfaces of said container structures;
   m) forming a conformal insulating layer on said exposed inner and outer surfaces of said container structures; and
   n) forming a second conductive layer over said conformal insulating layer.

17. The method as recited in claim 16, wherein an additional step of forming a rugged conductive layer is performed between steps (h) and (i).

18. The method as recited in claim 17, wherein said rugged conductive layer comprises rugged conductively doped polysilicon.

19. The method as recited in claim 18, wherein said rugged conductively doped polysilicon comprises the deposition of hemispherical grain polysilicon.

20. The method as recited in claim 16, wherein said insulating layer comprises an insulating layer planarized by chemical mechanical polishing.

21. The method as recited in claim 20, wherein said planarized insulating layer comprises BPSG.

22. The method as recited in claim 16, wherein said existing material comprises a layer of planarized TEOS.

23. The method as recited in claim 16, wherein said underlying conductive material comprises a conductive plug connecting to an underlying diffusion region.

24. The method as recited in claim 16, wherein said sacrificial layer comprises rugged polysilicon.

25. The method as recited in claim 24, wherein said rugged polysilicon comprises the deposition of hemispherical grain polysilicon.

26. The method as recited in claim 16, wherein said barrier layer comprises nitride.

27. The method as recited in claim 16, wherein said insulating spacers comprise oxide.

28. The method as recited in claim 16, wherein said first and second conductive layers comprise conductively doped polysilicon.

29. The method as recited in claim 16, wherein said filler material comprises photoresist.

30. The method as recited in claim 16, wherein said conformal insulating layer comprises a capacitor cell dielectric material.

31. The method as recited in claim 16, wherein said capacitor cell dielectric material is a material selected from the group consisting of oxide, nitride and any combination thereof.

32. A method for forming a stacked capacitor container structure capacitor cell between parallel conductive wordlines on a silicon substrate for a dynamic random access memory device, said method comprising the steps of:

a) forming a planarized BPSG layer over said parallel conductive wordlines and an existing planarized layer of TEOS;

b) providing openings into said planarized BPSG layer, said openings forming vertical sidewalls in said BPSG insulting layer that reside between neighboring conductive wordlines and thereby exposing underlying conductive plugs;

c) forming a rugged polysilicon sacrificial layer that makes contact with said underlying conductive plugs;

d) forming a nitride layer overlying and conforming to said rugged polysilicon sacrificial layer;

e) forming oxide spacers on the vertical sidewalls of the nitride layer;

f) removing portions of said nitride layer and said rugged polysilicon sacrificial layer that span between said oxide spacers to thereby expose a portion of said underlying conductive plugs;

g) removing said oxide spacers and thereby exposing the nitride layer;

h) forming a first conductive layer that conforms to said exposed nitride layer, makes contact to said underlying conductive plugs and thereby forms multiple containers;

i) forming a photoresist material in said container;

j) removing a portion of said conductive layer, said nitride layer and said rugged polysilicon sacrificial layer down to an upper portion of said insulating layer, thereby forming individual container structures;

k) removing said planarized BPSG layer, thereby exposing the rugged polysilicon sacrificial layer surrounding the outer surfaces of said container structures;

l) removing said rugged polysilicon sacrificial layer, said photoresist layer and the remaining nitride layer, thereby exposing the outer and inner surfaces of said container structures;

m) forming a conformal cell dielectric layer on said exposed inner and outer surfaces of said container structures; and n) forming a second conductive layer over said conformal cell dielectric layer.

33. The method as recited in claim 32, wherein an additional step of forming a rugged conductive layer is performed between steps (h) and (i).

34. The method as recited in claim 33, wherein said rugged polysilicon sacrificial layer comprises the deposition of hemispherical grain polysilicon.

35. The method as recited in claim 32, wherein said rugged polysilicon sacrificial layer comprises the deposition of hemispherical grain polysilicon.

36. The method as recited in claim 32, wherein said first and second conductive layers comprise conductively doped polysilicon.

37. The method as recited in claim 32, wherein said capacitor cell dielectric material is a material selected from the group consisting of oxide, nitride and any combination thereof.

38. The method as recited in claim 32, wherein said conductive plugs comprise a material selected from the group consisting of metal, metal silicides and conductively doped polysilicon.

* * * * *